United States Patent
Nayak et al.

(10) Patent No.: US 8,656,335 B2
(45) Date of Patent: *Feb. 18, 2014

(54) SYSTEM AND METHODS FOR INFERRING HIGHER LEVEL DESCRIPTIONS FROM RTL TOPOLOGY BASED ON CONNECTIVITY PROPAGATION

(75) Inventors: Anshuman Nayak, San Jose, CA (US); Samantak Chakrabarti, Kolkata (IN); Brijesh Agrawal, Greater Noida (IN); Nitin Bhardwaj, Delhi (IN)

(73) Assignee: Atrenta, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/532,175

(22) Filed: Jun. 25, 2012

(65) Prior Publication Data

US 2013/0290917 A1 Oct. 31, 2013

Related U.S. Application Data

(60) Provisional application No. 61/639,099, filed on Apr. 27, 2012.

(51) Int. Cl.
*G06F 17/50* (2006.01)

(52) U.S. Cl.
USPC ........... 716/130; 716/100; 716/101; 716/102; 716/104; 716/118; 716/119; 716/127; 716/129; 716/139

(58) Field of Classification Search
USPC ......... 716/100–104, 118–119, 127, 129–130, 716/139
See application file for complete search history.

(56) References Cited

U.S. PATENT DOCUMENTS

| | | | |
|---|---|---|---|
| 5,164,908 A * | 11/1992 | Igarashi | 716/124 |
| 6,219,821 B1 * | 4/2001 | Hagerman et al. | 716/107 |
| 6,295,636 B1 | 9/2001 | Dupenloup | |
| 6,980,975 B2 * | 12/2005 | Reed et al. | 706/47 |
| 7,694,241 B1 | 4/2010 | Jadcherla et al. | |
| 7,925,940 B2 | 4/2011 | Pandey et al. | |
| 8,185,849 B2 * | 5/2012 | Nakamura | 716/103 |
| 2008/0091981 A1 | 4/2008 | Dokken et al. | |
| 2009/0271750 A1 | 10/2009 | Richardson et al. | |
| 2010/0161303 A1 | 6/2010 | McGowan et al. | |
| 2010/0332172 A1 | 12/2010 | Kaufman et al. | |
| 2011/0185307 A1 | 7/2011 | Toyooka et al. | |
| 2011/0271241 A1 | 11/2011 | Krishnamoorthy et al. | |

* cited by examiner

*Primary Examiner* — Nghia Doan
(74) *Attorney, Agent, or Firm* — Sughrue Mion, PLLC

(57) ABSTRACT

A system and several methods for inferring higher level descriptions of circuit connectivity from register transfer level (RTL) netlists in order to provide more understandable and manageable design descriptions for complex System-on-Chip (SOC) designs, is provided. In particular, interface matching based on connectivity propagation is automatically performed whereby port names and properties on instances of functional elements and blocks are propagated to top level design ports as well as other instances of functional elements and blocks to create a more robust description of connectivity according to the RTL netlist, and to automatically form signal groupings that comprise a higher-level abstracted description. Also, a facility is included to allow user-guided grouping of instantiated interfaces with respect to actual signal names and properties in an RTL-level design.

15 Claims, 9 Drawing Sheets

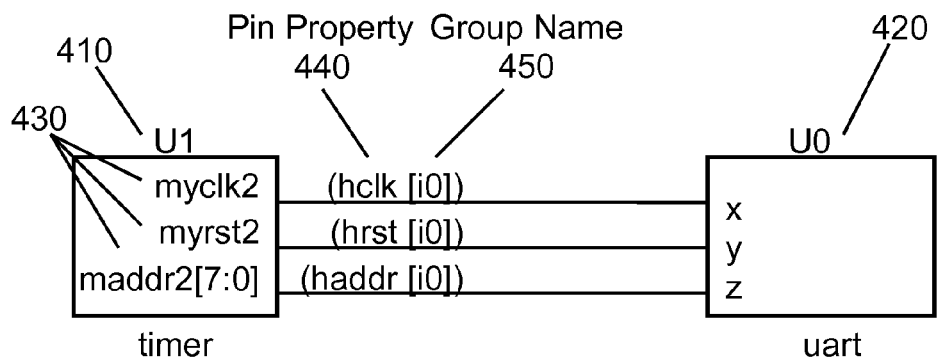
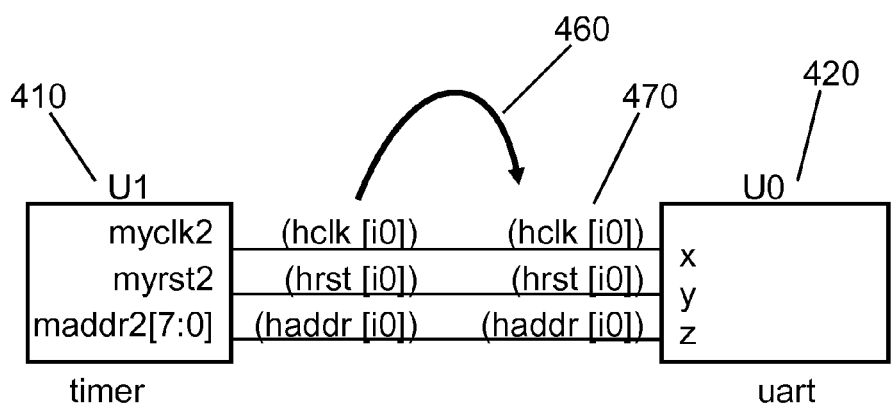
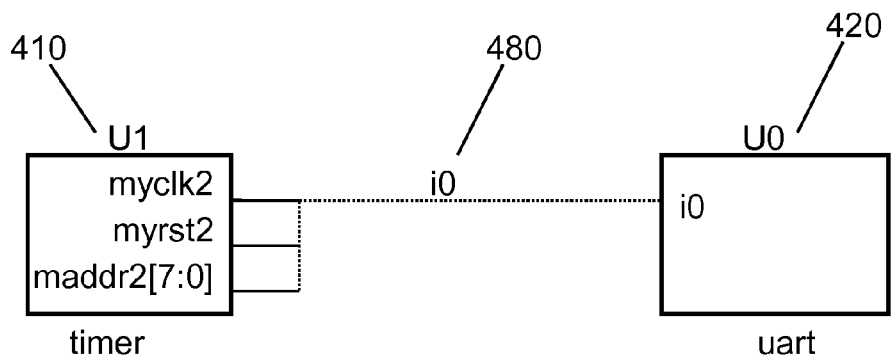
FIGURE 4

700

Signal groupings at ports on interconnected IP block instances — 710

720

| Instance | Instance A | Instance B | Instance C |
|---|---|---|---|
| Signal Grouping at Port on IP Block Instance | Clk<br>Rst<br>Addr | Clk<br>Rst<br>Addr | Clk<br>Rst<br>Data |

Signal grouping choices resulting from different heuristic analysis methods — 740

| Heuristic 1 | Heuristic 2 | Heuristic 3 |
|---|---|---|
| Clk<br>Rst<br>Addr | Clk<br>Rst | Clk<br>Rst<br>Addr<br>Data |

SYSTEM AND METHODS FOR INFERRING HIGHER LEVEL DESCRIPTIONS FROM RTL TOPOLOGY BASED ON CONNECTIVITY PROPAGATION

CROSS-REFERENCE TO RELATED PATENT APPLICATION

The present application claims priority from U.S. Provisional Application No. 61/639,099, filed on Apr. 27, 2012, the disclosure of which is incorporated herein by reference in its entirety.

BACKGROUND

1. Field

The present invention relates generally to Electronic Design Automation (EDA), and in particular to the processing of netlists for System-on-Chip (SOC) designs relative to signal naming, signal connectivity, and different levels of abstraction within an SOC description.

System-On-Chip (SOC) designs are large and complex, frequently reaching sizes in excess of 50 million transistors. As a result, when a new or enhanced application is to be addressed by a new design, the new design is most often a modification of a previous SOC design. Typically, an engineering organization attempts to use as much of the previous design as possible in order to save time, resources, and expense.

When attempting to reuse an existing SOC design, a common difficulty encountered by a design team is that the existing design may be poorly documented, or alternately simply exists only at a low register transfer level (RTL) description level with individual signal names which when viewed presents an overwhelming degree of complexity making it difficult to understand the design. Understanding the design is critical to modifying and reusing an existing design. Since creation of SOC designs typically require a team of many individuals, it is also common that at least some of the original designers are no longer available to explain an existing design—having either left the company or moved on to other projects.

Therefore, it would be useful to have an automated way to generate a higher-level description of an existing SOC design where in the higher-level description related signals are grouped together to create an abstracted description having a lower level of apparent complexity, and where a graphical representation of such a higher-level design will be much easier to understand and modify.

Note that throughout this specification reference will frequently be made to "IP blocks". Here "IP" refers to "Intellectual Property"; however, in the context of SoC design, IP block specifically refers to a functional circuit or macro circuit that may be connected to other such functional circuits as the overall SoC design is built. These IP blocks are often purchased or licensed from other companies and therefore may contain some degree of IP. Many SoC designers refer to such IP blocks or macros as simply "IPs".

SUMMARY

A system and several methods for automatically analyzing and modifying an RTL-level netlist to produce a higher level description is provided.

According to an exemplary method for analyzing a circuit description netlist to produce a higher level description, the netlist is received. The netlist includes IP block instances having one or more ports with signal names and properties attached. The method further includes propagating, by one or more processors, the signal names and properties from at least one of the IP block instances to another of the IP block instances according to connectivity represented in the netlist; grouping the signal names into a plurality of groups according to the properties and the connectivity; assigning at least one of the groups of the signal names to a higher-level interface definition; and saving the grouped signal names in memory.

An exemplary system is provided to implement the above method. Furthermore, a computer-readable storage medium is also provided with instructions for implementing the above exemplary method.

BRIEF DESCRIPTION OF THE DRAWINGS

The subject matter that is regarded as the invention is particularly pointed out and distinctly claimed in the claims at the conclusion of the specification. The foregoing and other objects, features, and advantages of exemplary embodiments of the invention will be apparent from the following detailed description taken in conjunction with the accompanying drawings.

FIG. 4 shows an example of lateral traversal of a design hierarchy;

FIG. 7 shows a non-limiting example whereby different heuristic analysis methods are used to choose a single signal grouping for multiple interconnected IP block instances;

DETAILED DESCRIPTION

A system and several methods are disclosed for inferring higher level descriptions of circuit connectivity from register transfer level (RTL) netlists in order to provide more understandable and manageable design descriptions for complex System-on-Chip (SOC) designs. In particular, interface matching based on connectivity propagation is automatically performed whereby port names and properties on instances of functional elements and blocks are propagated to top level design ports as well as other instances of functional elements and blocks to create a more robust description of connectivity according to the RTL netlist, and to automatically form signal groupings that form a higher-level abstracted description. Also, a facility is included to allow user-guided grouping of instantiated interfaces with respect to actual signal names and properties in an RTL-level design.

An interface is defined as a collection of logical names and their characteristics or properties which are best defined together. Characteristics include signal attributes sometimes referred to as signal properties. It is possible to create a rule-based analysis and grouping process that will successfully group some of the signals in a netlist. An example of a rule-based analysis and grouping process may be found in the related U.S. application Ser. No. 13/433,395. However, most SOC designs comprise a wide variety of IP blocks or macros that frequently were supplied by diverse sources, and in different time periods. As such, the port names (signal names) and properties on some IP blocks may bear no resemblance to the port names and properties on other IP blocks to which they are connected. As shown in S130 of FIG. 1, a rule based grouping process may preferably be run first since it will provide some consistent groupings where the pre-existing signal names and properties allow, thus providing a starting point for signal names and properties to be propagated via netlist connectivity to IP block instances where a rule based analysis was previously less effective.

Figure 1:
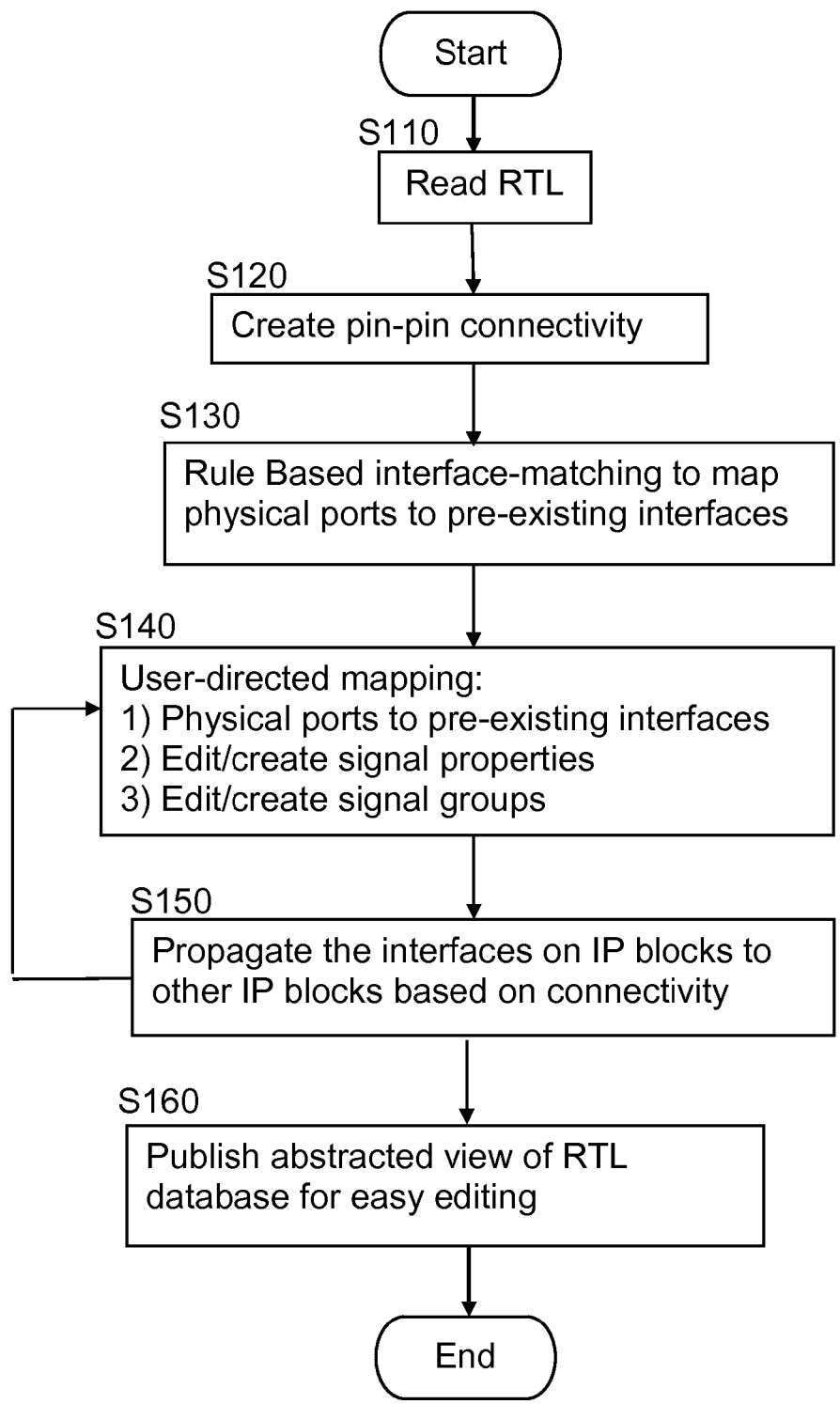
FIG. 1 shows an exemplary and non-limiting overview flowchart of a process where rule-based analysis and connectivity-based analysis are performed on a list of signal names and signal properties to produce signal groupings that comprise a higher level description of a circuit.

FIG. 1 shows an exemplary and non-limiting overview flowchart of a process where rule-based analysis and connectivity-based analysis are performed on a list of signal names and signal properties to produce signal groupings that comprise a higher level description of a circuit. In S110 of FIG. 1, an RTL netlist is read followed by establishing pin-to-pin connectivity in S120. Choices for signal names in existing SOC designs are frequently inconsistent and/or poorly planned, and therefore the result of S130 where rule-based analysis is run may frequently not provide the most acceptable result for signal groupings, especially on the first pass. Therefore a user may optionally make a determination as to whether the resultant signal groupings are acceptable in creating a more understandable and concise higher-level description. A user may then in S140 manually specify partial signal groupings or signal properties, or manually map a port to a pre-existing interface. In S150 an automatic process will propagate signal names and properties from at least a port on one IP block instance to port(s) of other IP block instances to which it is connected, while traversing the design hierarchy in multiple directions as described herein. Finally, signal groupings are collected and published in S160 to produce a higher level abstracted view of the design that is easier to understand than the original RTL netlist.

Pre-Existing Interfaces

A pre-existing interface may be user-provided or alternately be a standard interface such as an interface associated with a standard IP block from companies like ARM Ltd. and Sonics, Inc. In general a definition for a particular standard or pre-existing interface will include a list of logical names plus optionally attributes such as for example indicating the direction of a logical name in a master or slave instantiation of an interface, should that interface include a master/slave functionality.

IP Block Interface Definitions—Signal Names and Properties

In general, a standard or preexisting interface definition may include for each logical port one or more of the following attributes/properties from the following non-limiting, exemplary list: LogicalPortName; Direction; MSB; LSB; sig type; default; registered; optional; and requiresDriver.

As described herein, a user can create some complex groupings based on interface names. In addition to pre-existing and standard interfaces that may be supplied, such as but not limited to an ARM interface, a user can create more custom interfaces with custom names to allow the grouping of signals as a result of signal and property name propagation via traversal of a netlist connectivity.

Propagation via Hierarchy Traversal

Figure 2:
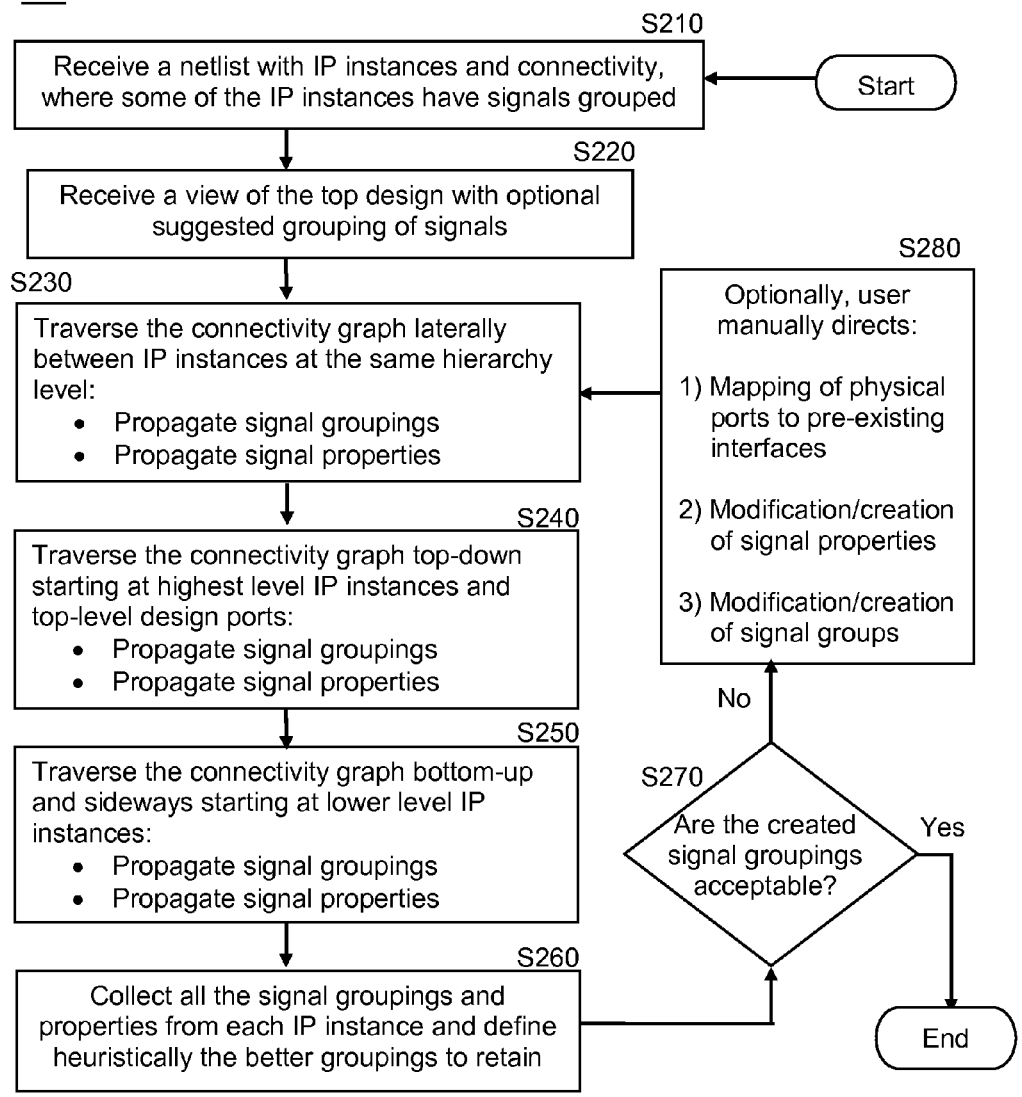
FIG. 2 shows an exemplary and non-limiting flowchart for a process that propagates signal names and properties according to netlist connectivity in order to facilitate grouping of signals.

FIG. 2 shows an exemplary flowchart for a process whereby signal names and signal properties are propagated according to netlist connectivity to produce signal groupings whereby a higher-level description of an SOC design is provided. In S210 a netlist is received containing IP instances and connectivity and where some of the IP instances have pre-existing groups of signals, these groups containing signal names and signal properties. In S220 a view of the top level design containing the I/O pins of an SOC is received, and where signal groupings may optionally pre-exist. In S230, a process is performed whereby the connectivity graph for the netlist is traversed in a lateral direction between IP block instances at the same hierarchy level, thus propagating both signal groupings and signal properties from one IP block instance to another IP block instance. In S240, a process is performed whereby the connectivity graph for the netlist is traversed in a top-down direction between the top-level I/O pins and the port(s) of any IP block instances at the hierarchy level below, and between the ports of an IP block instance at any level of the design hierarchy and the port(s) of any IP block instances in the level below that instance, thus propagating both signal groupings and signal properties. In S250, a process is performed whereby the connectivity graph for the netlist is traversed in a bottom-up direction between the port(s) of any IP block instances one level below the top-level and the top-level I/O pins, and also between the port(s) of an IP block instance at any level of the design hierarchy and the port(s) of any IP block instances in the level above that instance, thus propagating both signal groupings and signal properties.

In S260, signal groupings in the design are collected. After all traversal of the hierarchy has been performed, it may transpire that on a port of a first IP block instance one possible signal grouping has been established, while on a port of a second IP block instance a different signal grouping has been established, the first port being interconnected to the second port. At the same time, per S260 it is appropriate for purposes of consistency to choose which grouping should be represented in the resultant high level design description. FIG. 7 describes in detail how it is decided which grouping to retain.

In S270, the process offers the user an opportunity to state whether the signal groupings that have been created as a result of propagation are acceptable. If they are acceptable the process is complete. If they are not acceptable, then in S280 the user may optionally direct the process manually by manually modifying or creating signal properties, manually modifying or creating signal groups, or manually mapping physical ports to pre-existing interfaces. Following any manually-directed steps, the process of propagating signal properties and groups via hierarchy traversal will optionally be performed again.

Figure 3:
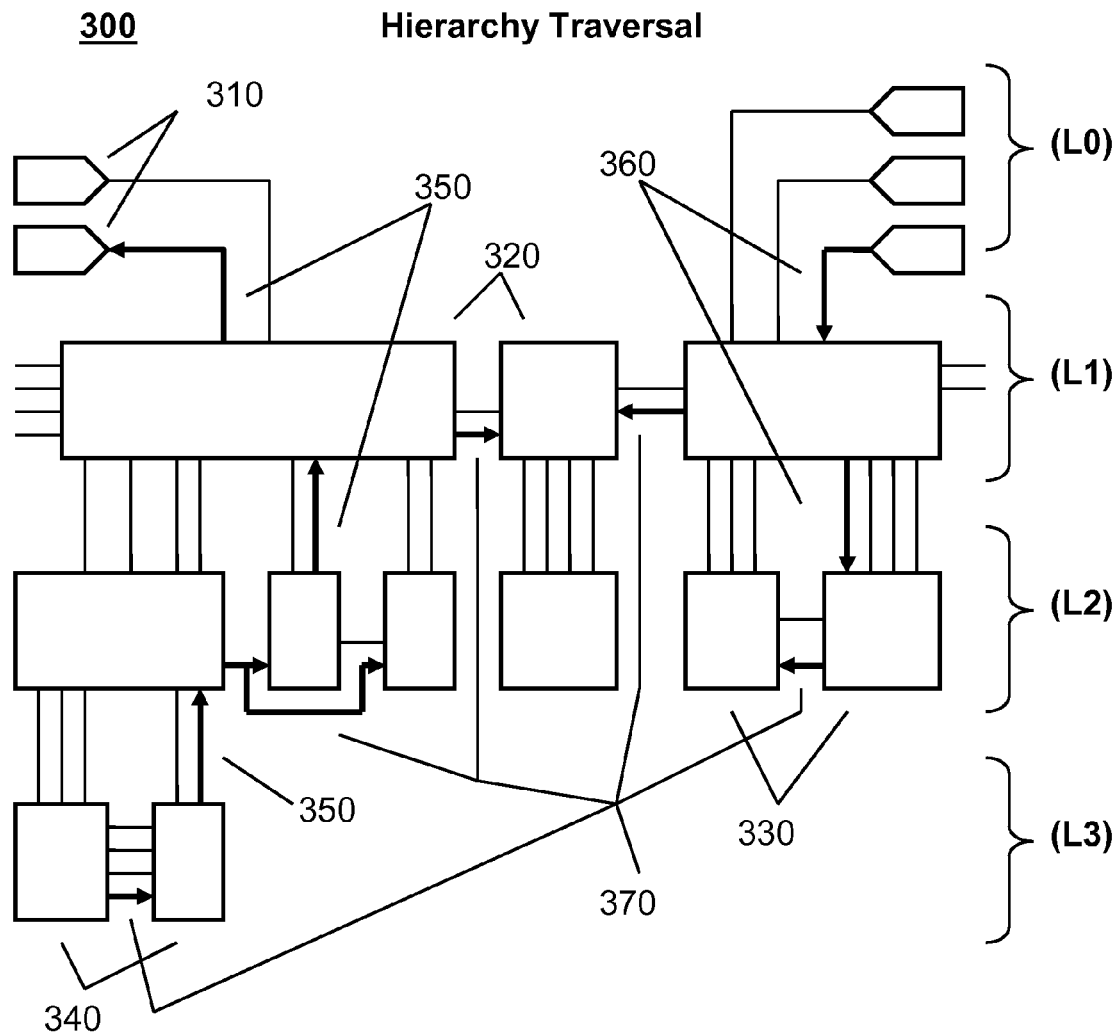
FIG. 3 shows an exemplary diagram where different levels of an SOC design hierarchy are shown including example paths for top-down, bottom-up, and lateral traversal of the hierarchy.

FIG. 3 shows a cross-section view 300 of a design hierarchy for an exemplary SOC design with the top-level L0 shown at the top and the bottom level L3 shown at the bottom. I/O pins 310 for the SOC design are on level L0 of the hierarchy. These pins connect to IP block instances 320 on level L1. Underneath instances 320 are IP block instances 330 on level L2, and underneath those instances are IP block instances 340 on level L3. Examples of connection paths where propagation is performed according to bottom-up traversal include nets 350. Examples of connection paths where propagation is performed according to top-down traversal include nets 360. Examples of connection paths where propagation is performed according to lateral traversal of the hierarchy include nets 370.

FIG. 4 provides a progressive view 400 of a process of lateral traversal. In FIG. 4a, propagation occurs starting at IP block instance 410, and by traversing netlist connectivity ends at a port on IP block instance 420. Port names 430 on instance 410 are different from and bear no relationship to port names on instance 420. Here, a rule-based analysis would probably not associate the ports on instance 410 with those on instance 420; however, by propagating 460 pin properties 440 and group name 450 from instance 410 to instance 420 as shown in FIG. 4b, signal properties and group name 470 may now be also associated with instance 420. FIG. 4c shows how the signal grouping connecting instance 410 and 420 may as a result be represented by a single connection 480 called i0.

Figure 5:
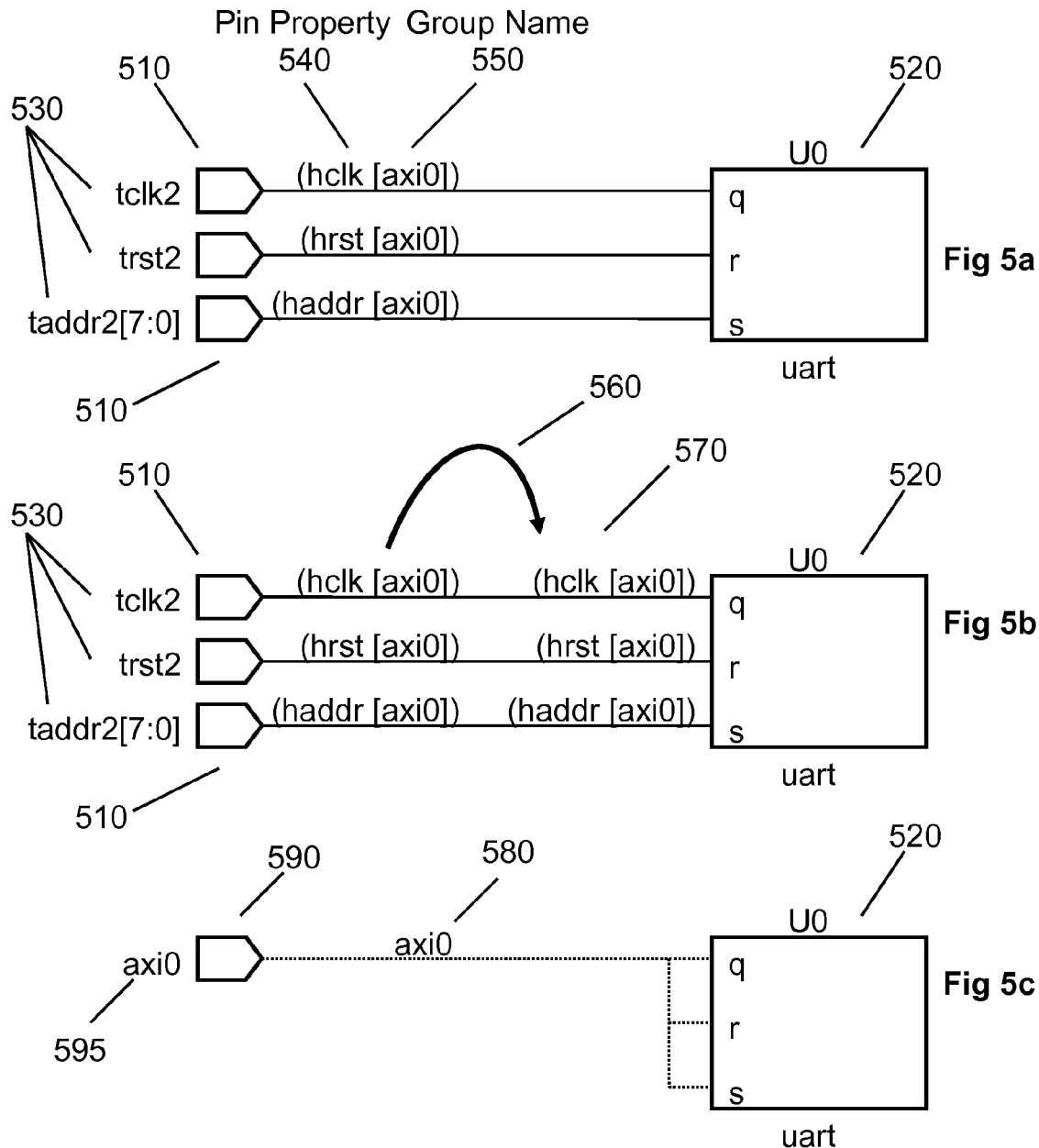
FIG. 5 shows an example of top-down traversal of a design hierarchy.

FIG. 5 provides a progressive view 500 of a process of top-down traversal. In FIG. 5a, propagation occurs starting at I/O pins 510, and by top-down traversing netlist connectivity ends at a port on IP block instance 520. Port names 530 on I/O pins 510 are different from and bear no relationship to port names on instance 520. Here, a rule-based analysis would probably not associate the ports on I/O pins 510 with those on instance 520. However, by propagating 560 pin properties 540 and group name 550 from I/O pins 510 to instance 520 as shown in FIG. 5b, signal properties and group name 570 may now be also associated with instance 520. FIG. 5c shows how the signal grouping connecting I/O pins 510 and IP block instance 520 may as a result be represented by a single connection 580 called axi0.

Figure 6:
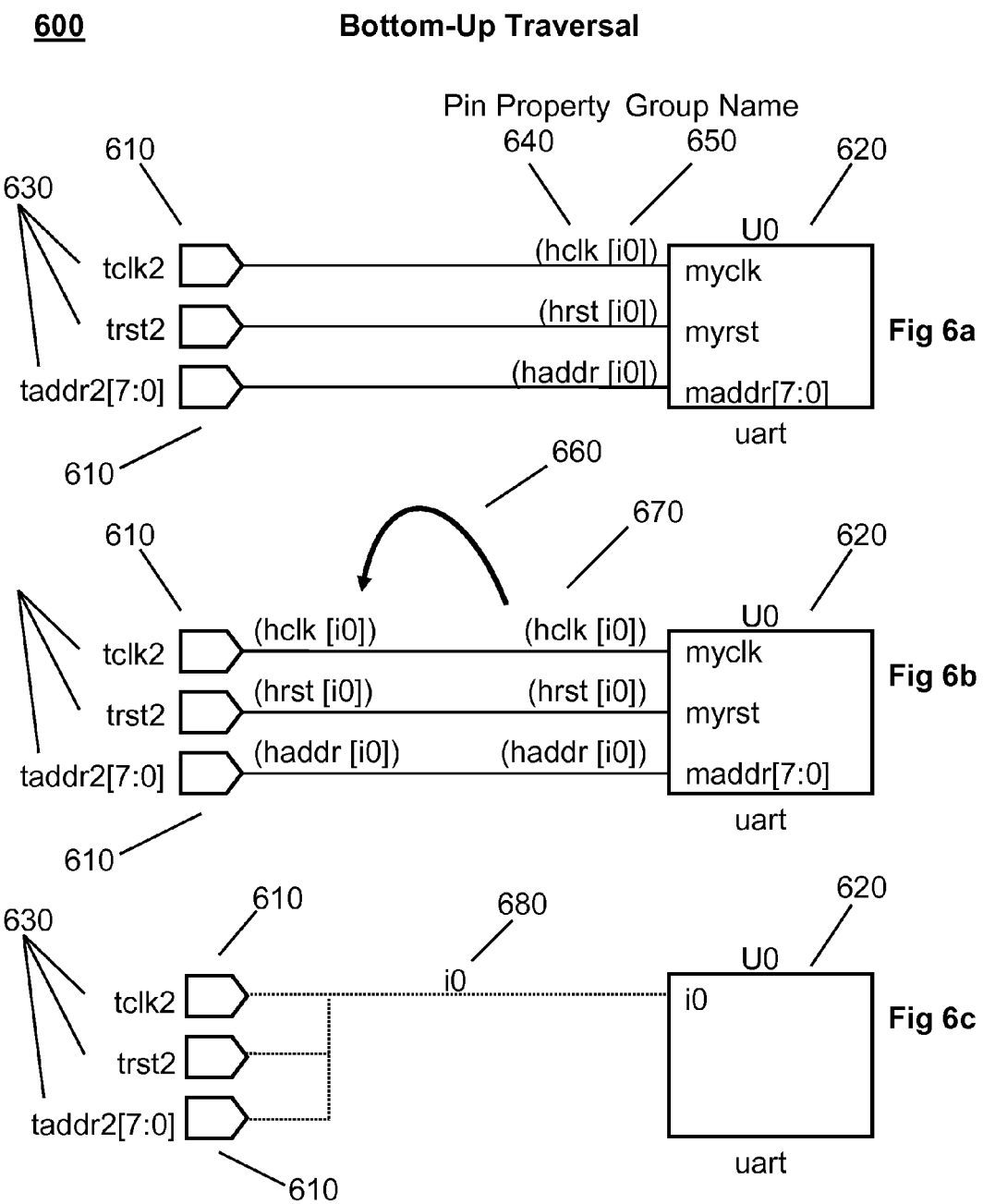
FIG. 6 shows an example of bottom-up traversal of a design hierarchy.

FIG. 6 provides a progressive view 600 of a process of bottom-up traversal. In FIG. 6a, propagation occurs starting at a port on IP block instance 620, and by bottom-up traversing netlist connectivity ends at I/O pins 610. Port names 630 on instance I/O pins 610 are different from and may bear no relationship to port names on instance 620. Here, a rule-based analysis might not associate the ports on I/O pins 610 with those on instance 620; however. by propagating 660 pin properties 640 and group name 650 from IP block instance 620 to I/O pins 610 as shown in FIG. 6b, signal properties and group name 670 may now be also associated with instance 610. FIG. 6c shows how the signal grouping connecting I/O pins 610 and IP block instance 620 may as a result be represented by a single connection 680 called i0.

Tables 700 shown in FIG. 7 provide a non-limiting example of heuristic analysis methods for determining which signal grouping should be represented in a resultant high level design description when it transpires that on a port of a first IP block instance one possible signal grouping has been established, while on a port of a second IP block instance a different signal grouping has been established, the first port being interconnected to the second port.

In particular, table 710 in FIG. 7a shows signal groupings on three interconnected IP block instances 720 that resulted from propagating signal names and properties by hierarchy traversal. Note that the groupings 730 on Instance A and Instance B are the same, while the grouping on Instance C is different. In order to pick one grouping to represent the connection between these instances, table 740 in FIG. 7b shows the results of three exemplary and non-limiting heuristic analysis methods which may be used in making such a decision. The analysis process which performs these methods can be set to choose the result of any one of the three, or the result of another method not described here, as the default behavior. The three exemplary heuristic analysis methods per table 740 are:

Heuristic 1: A signal grouping is chosen that appears maximally in all of the multiple interconnected IP block instances: Clk, Rst, and Addr;

Heuristic 2: A signal grouping is chosen that is the intersection of all signals appearing in signal groupings at each of the multiple interconnected IP block instances: Clk and Rst;

Heuristic 3: A signal grouping is chosen that is the union of all signals appearing in signal groupings at each of the multiple interconnected IP block instances: Clk, Rst, Addr, and Data.

User-Directed Mapping

Direct Mapping or User-Directed Mapping enables a user to make incremental changes to one or more signal groupings or signal properties. A user can add more signals to a grouping or delete some signals from a grouping. A user may manually map a port on an IP block instance to a pre-existing interface. Accordingly, any user-made changes to a grouping are maintained to ensure that any subsequent automated incremental changes use that grouping or partial grouping as a starting point. Subsequently, the results of the propagation and grouping processes described herein will improve incrementally, adding signal names to improve a grouping based on the starting point supplied by the user. Alternately, more groups based on iteratively run automated propagation may be created.

Figure 8:
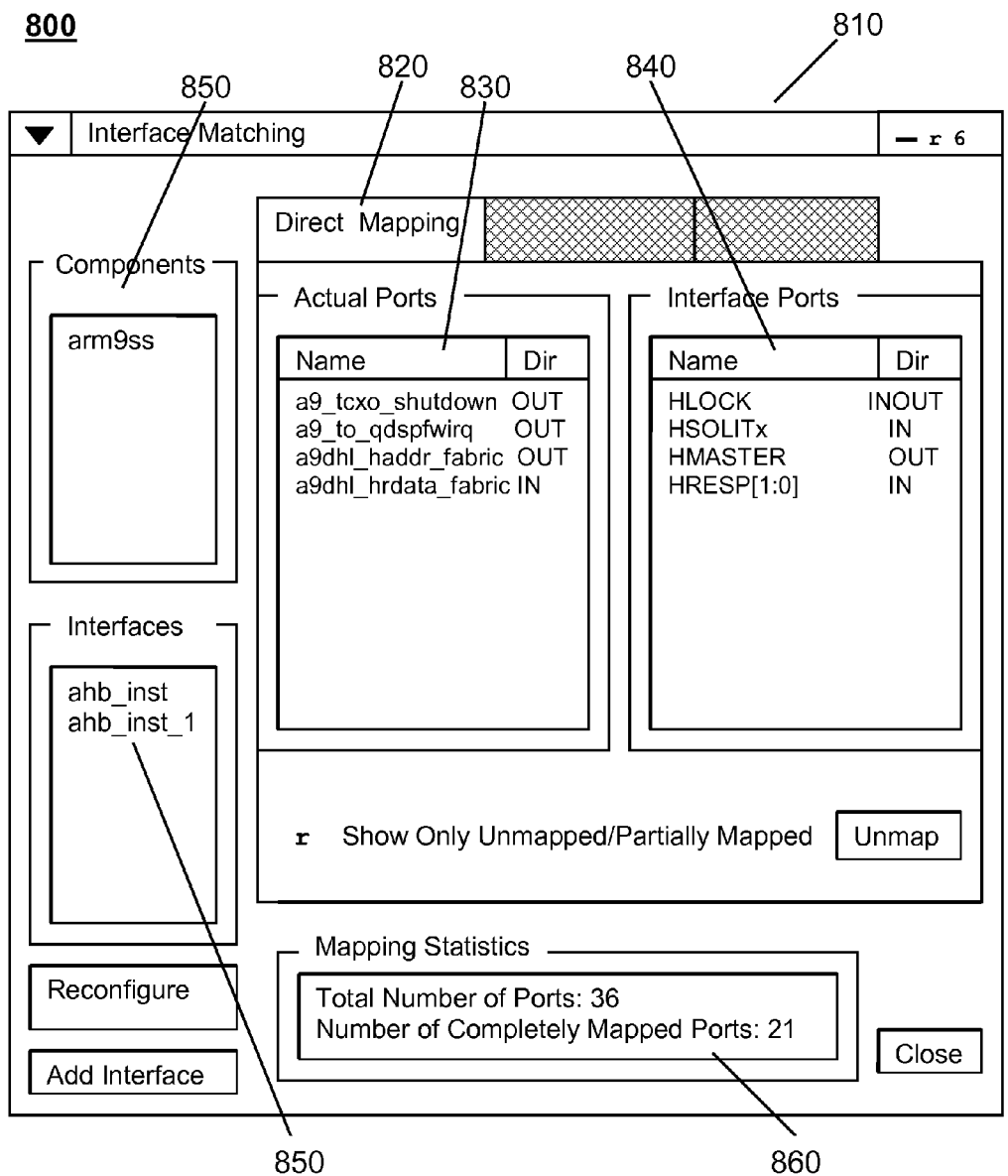
FIG. 8 shows an example of a user interface in which a user manually assigns signal groups and signal properties.

FIG. 8 shows an exemplary and non-limiting User Interface (UI) 800 for controlling operation according to the invention with respect to user-directed mapping. User interface window 810 is shown with the Direct Mapping tab 820 selected. The direct mapping tab provides a list of actual ports 830 in the RTL level netlist as well as a list 840 of logical interface ports which the software will eventually associate with groups of signal names and properties from list 830. Using the interface of window 810, the user may associate specific port names 830 with an interface name 840 to create a partial grouping of signal names. They may also add or modify signal properties, thus providing additional pre-existing information to be used in further automated propagation of signal properties and groups using hierarchy traversal. Pre-existing interfaces 850 are shown as well as mapping statistics 860.

EDA System and Software

Figure 9:
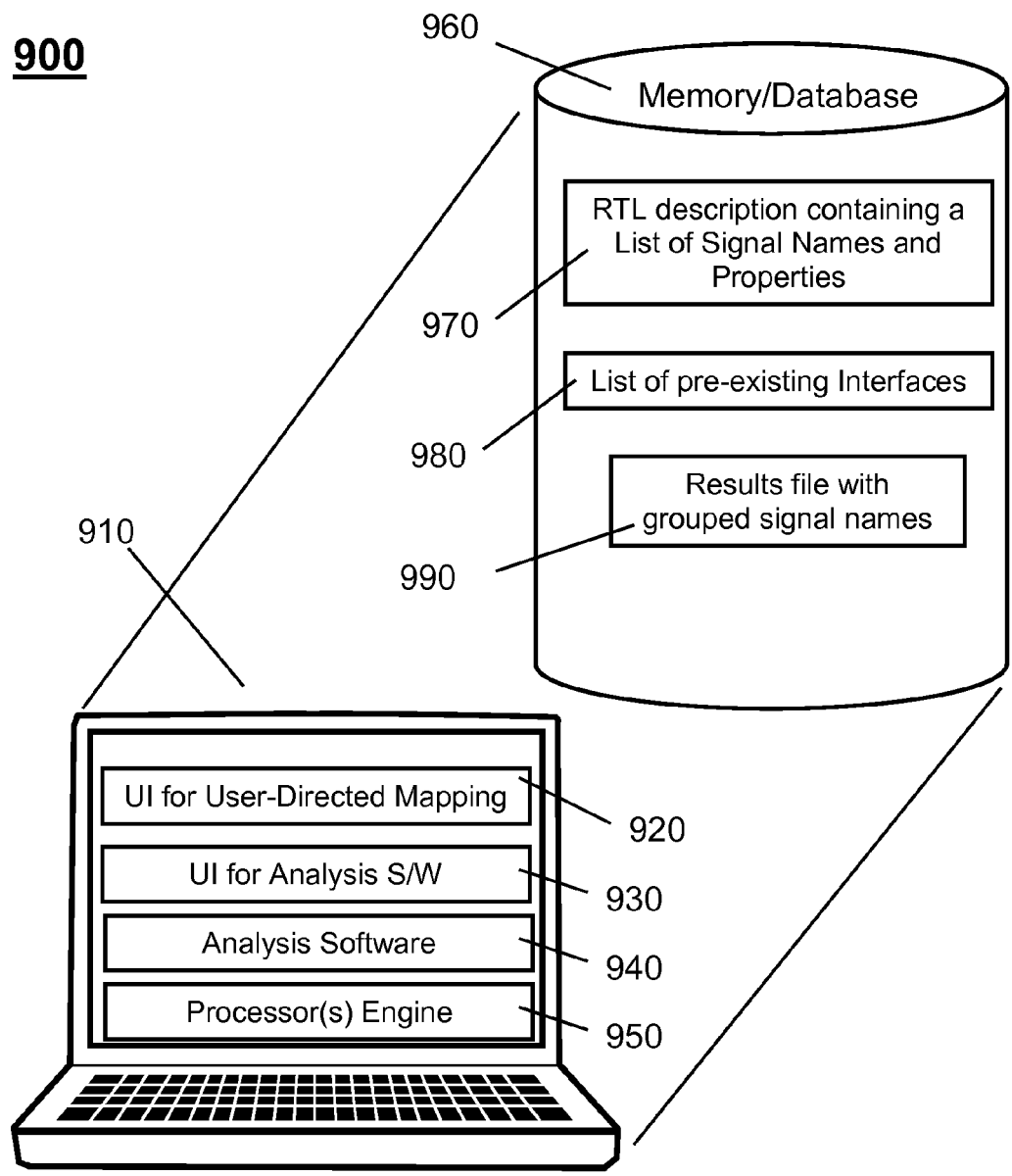
FIG. 9 shows a block diagram for an exemplary system.

In one exemplary embodiment, the operations described above may be implemented by a computer platform 910 of some kind Such a platform may include a dedicated workstation, a central computer operated from a remote terminal, or one or more computing resources located on the Internet including resources of the type now known as the "Cloud", and the likes. An exemplary and non-limiting embodiment of a dedicated computer aided design (CAD) or EDA system 900 according to the invention is shown in FIG. 9. Here, a workstation 910 operates a UI 920 for providing direct mapping of signal names and groups, UI 930 for operating a software program 940 to automatically propagate signal names and properties according to hierarchy traversal and for automatically grouping signals. Analysis software program 940 contains a series of instructions that are executed on one or more processors comprising engine 950 upon which software for workstation 910 operates.

A memory and database resource 960 for workstation 910 is also shown in FIG. 9. The memory and database resource 960 may be located physically within workstation 910 or alternately be external to workstation 910. Memory and database resource 960 contains an RTL description 970 containing a list of signal names and properties which a user may wish to propagate and group, a list of pre-existing interfaces 980, and a results file 990 containing signal names and properties which have been grouped.

The foregoing detailed description has set forth a few of the many forms that the invention can take. It is intended that the foregoing detailed description be understood as an illustration of selected forms that the invention can take and not as a limitation to the definition of the invention. It is only the claims, including all equivalents that are intended to define the scope of this invention.

At least certain principles of the invention can be implemented as hardware, firmware, software or any combination thereof. Moreover, the software is preferably implemented as an application program tangibly embodied on a program storage unit, a non-transitory user machine readable medium, or a non-transitory machine-readable storage medium that can be in a form of a digital circuit, an analogy circuit, a magnetic medium, or combination thereof. The application program may be uploaded to, and executed by, a machine comprising any suitable architecture. Preferably, the machine is implemented on a user machine platform having hardware such as one or more central processing units ("CPUs"), a memory, and input/output interfaces. The user machine platform may also include an operating system and microinstruction code. The various processes and functions described herein may be either part of the microinstruction code or part of the application program, or any combination thereof, which may be executed by a CPU, whether or not such user machine or processor is explicitly shown. In addition, various other peripheral units may be connected to the user machine platform such as an additional data storage unit and a printing unit.

What is claimed is:

1. A computerized method for analyzing a circuit description netlist to produce a higher level description, the method comprising:
    receiving the netlist, the netlist including a hierarchy of IP block instances on two or more levels, the IP block instances having one or more ports with signal names and properties attached, wherein at least some of the signal names or properties on at least one net in the circuit descriptions netlist are dissimilar;
    propagating, by one or more processors, signal names and properties from at least a first IP block instance to a second IP block instance according to connectivity between the first and second IP block instances as represented in the netlist, wherein by said propagating at least one signal name or property on the first IP block instance is assigned to the second IP block instance, thereby replacing an existing signal name or property on the second IP block instance;
    grouping the signal names into a plurality of groups according to the properties and the connectivity;
    assigning at least one of the groups of the signal names to a higher-level interface definition; and
    saving the grouped signal names in memory.

2. The method of claim 1, further comprising:
    receiving an indication from a user regarding the acceptability of the grouping of the signal names;
    if the grouped signal names are not yet acceptable, receiving at least one manually specified signal property or signal grouping; and
    propagating the signal names and properties from at least one of the IP block instances to another one of the IP block instances according to connectivity represented in the netlist, while keeping the at least one manually specified signal property or signal grouping intact.

3. The method of claim 2, wherein a user interface functionality is provided to facilitate the manually specifying of the at least one signal property or signal grouping by a user.

4. The method of claim 1, wherein the netlist contains a design hierarchy, and the signal names and properties are propagated by traversing the hierarchy in a lateral direction.

5. The method of claim 1, wherein the netlist contains a design hierarchy, and the signal names and properties are propagated by traversing the hierarchy in a top-down direction.

6. The method of claim 1, wherein the netlist contains a design hierarchy, and the signal names and properties are propagated by traversing the hierarchy in a bottom-up direction.

7. The method of claim 1, wherein after performing the propagation of signal names and properties by traversing a design hierarchy resulting in differing signal groupings between multiple interconnected IP block instances, a single signal grouping is chosen from said differing signal groupings by one of:
    choosing a signal grouping that appears maximally in all of said multiple interconnected IP block instances;
    choosing a signal grouping that is the intersection of all signals appearing in signal groupings at each of said multiple interconnected IP block instances; and
    choosing a signal grouping that is the union of all signals appearing in signal groupings at each of said multiple interconnected IP block instances.

8. A system for analyzing an RTL-level circuit description netlist to produce a higher level circuit description, the system comprising:
    one or more hardware processors;
    a memory that contains instructions for execution by the one or more hardware processors; and
    a database for storing the RTL-level circuit description netlist and the higher-level circuit description,
    wherein:
    the one or more hardware processors are configured to:
    receiving the netlist, the netlist including a hierarchy of IP block instances on two or more levels, the IP block instances having one or more ports with signal names and properties attached, wherein at least some of the signal names or properties on at least one net in the circuit descriptions netlist are dissimilar;
    propagate signal names and properties from at least a first IP block instance to a second IP block instance according to connectivity between the first and second IP block instances as represented in the netlist, wherein by said propagating at least one signal name or property on the first IP block instance is assigned to the second IP block instance, thereby replacing an existing signal name or property on the second IP block instance;
    group together the signal names into a plurality of groups according to the signal properties and the connectivity;
    assign at least one of the groups of signal names to a higher-level interface definition; and
    save the grouped signal names in the database.

9. The system of claim 8, wherein:
    the one or more hardware processors are further configured to:
    receive an indication from a user regarding the acceptability of the grouping of the signal names;
    receive from a user, at least one manually specified signal property or signal grouping if the grouped signal names are not yet acceptable; and
    propagate the signal names and properties from at least one of the IP block instances to another of the IP block instances according to connectivity represented in the netlist, while keeping the at least one manually specified signal property or signal grouping intact.

10. The system of claim 9, wherein a user interface functionality is provided to facilitate the manual specification of the at least one signal property or signal grouping by the user.

11. The system of claim 8, wherein the netlist contains a design hierarchy, and the signal names and properties are propagated by traversing the hierarchy in a lateral direction.

12. The system of claim 8, wherein the netlist contains a design hierarchy, and the signal names and properties are propagated by traversing the hierarchy in a top-down direction.

13. The system of claim 8, wherein the netlist contains a design hierarchy, and the signal names and properties are propagated by traversing the hierarchy in a bottom-up direction.

14. The system of claim 8, wherein after performing propagation of signal names and properties by traversing a design hierarchy resulting in differing signal groupings between multiple interconnected IP block instances, a single signal grouping is chosen from said differing signal groupings by heuristic analysis, wherein:
- a signal grouping is chosen that appears maximally in all of said multiple interconnected IP block instances; or
- a signal grouping is chosen that is the intersection of all signals appearing in signal groupings at each of said multiple interconnected IP block instances; or
- a signal grouping is chosen that is the union of all signals appearing in signal groupings at each of said multiple interconnected IP block instances.

15. A non-transitory computer-readable storage medium storing instructions for enabling a processor to implement a method of analyzing a circuit description netlist to produce a higher level description, the method comprising:
- receiving the netlist, the netlist including a hierarchy of IP block instances on two or more levels, the IP block instances having one or more ports with signal names and properties attached, wherein at least some of the signal names or properties on at least one net in the circuit descriptions netlist are dissimilar;
- propagating signal names and properties from at least a first IP block instance to a second IP block instance according to connectivity between the first and second IP block instances as represented in the netlist, wherein by said propagating at least one signal name or property on the first IP block instance is assigned to the second IP block instance, thereby replacing an existing signal name or property on the second IP block instance;
- grouping the signal names into a plurality of groups according to the properties and the connectivity;
- assigning at least one of the groups of the signal names to a higher-level interface definition; and
- saving the grouped signal names in memory;
- saving the grouped signal names.

* * * * *